United States Patent [19]
Caser et al.

[11] Patent Number: 5,793,679
[45] Date of Patent: Aug. 11, 1998

[54] VOLTAGE GENERATOR FOR ELECTRICALLY PROGRAMMABLE NON-VOLATILE MEMORY CELLS

[75] Inventors: Fabio Tassan Caser, Milan; Marco Dellabora, Carpiano; Marco Defendi, Sulbiate, all of Italy

[73] Assignee: SGS-Thomson Microelectronics S.r.l., Agrate Brianza, Italy

[21] Appl. No.: 735,709

[22] Filed: Oct. 23, 1996

[30] Foreign Application Priority Data

Oct. 31, 1995 [IT] Italy ................ 95830461

[51] Int. Cl.$^6$ ............................ G11C 13/00
[52] U.S. Cl. .................. 365/185.27; 365/226
[58] Field of Search ............. 365/185.27, 189.01, 365/226, 227, 228

[56] References Cited

U.S. PATENT DOCUMENTS

| | | | |
|---|---|---|---|
| 5,202,588 | 4/1993 | Matsuo et al. | 307/296.2 |
| 5,263,000 | 11/1993 | Van Buskirk et al. | 365/226 |
| 5,301,097 | 4/1994 | McDaniel | 363/60 |
| 5,313,429 | 5/1994 | Chevallier et al. | 365/226 |

FOREIGN PATENT DOCUMENTS

| | | |
|---|---|---|
| 0 292 269 | 11/1988 | European Pat. Off. . |
| 0 593 105 | 4/1994 | European Pat. Off. . |
| 55-090139 | 7/1980 | Japan . |

*Primary Examiner*—Terrell W. Fears
*Attorney, Agent, or Firm*—David V. Carlson; Robert E. Mates; Seed and Berry LLP

[57] ABSTRACT

A voltage generator for electrically programmable non-volatile memory cells, constructed of a number of charge pump circuits having inputs controlled by a number of phase generators. The charge pump circuits are laid as pairs of first and second charge pump circuits. The first charge pump circuits are active when the second charge pump circuits are inactive, and vice versa.

36 Claims, 11 Drawing Sheets

VOLTAGE GENERATOR FOR ELECTRICALLY PROGRAMMABLE NON-VOLATILE MEMORY CELLS

FIELD OF THE INVENTION

This invention relates to a voltage generator for electrically programmable non-volatile memory cells, and more particularly, to a voltage generator having a number of charge pump circuits with their inputs controlled by a number of phase generators.

BACKGROUND OF THE INVENTION

As is well known, a semiconductor non-volatile memory structure comprises a matrix array of memory cells, each formed by a MOS transistor having a floating gate terminal formed above its channel region. Each cell also comprises a second terminal, called the control gate, which is driven by means of suitable control voltages. Other terminals of the transistor are known as drain, source and body terminals.

A non-volatile memory integrated on a semiconductor comprises an array of cells in a matrix layout of rows or word lines and columns or bit lines. The cells in one word line share the electric line which drives their respective control gates, and the cells in one bit line have their drain terminals in common. Through the application of suitable voltage values to the terminals of the cell, the amount of charge present in the floating gate can be changed, thereby allowing the transistor to take either of two logic states.

The floating gate has a high impedance toward any other terminals of the cell, and the charge stored therein can be retained for an indefinite length of time, even after the power supply to the circuit in which it is connected is disconnected. Thus, the cell can function as a non-volatile memory. The operation whereby charge is stored into the floating gate is called a "programming phase."

Each individual cell is programmed by a hot electron injection process hereby electrons can be trapped within the floating gate as the control gate is put in contact with approximately 12 volts, with the source terminal being connected to ground and the drain terminal held at a drain voltage of about 5.5 volts. It is a well-recognized fact that non-volatile memory cells, particularly those of the FLASH type, require accurate control of the drain voltage applied to the bit line during the programming phase. Such a voltage should, in fact, satisfy the following set of conditions:

- it should be sufficiently high to permit fast cell programming;
- at the same time, it should be sufficiently low to avoid the inception of the so-called "soft-erasing" phenomenon, whereby the cell would be partially erased or the cell characteristics degrade in use; and
- it should be adapted to avoid, for reliability reasons, triggering the phenomenon known as the "parasitic bipolar" phenomenon.

The optimum range for the drain voltage is usually a fairly narrow one, typically from 5 to 6 volts. It should be further noted that the above-listed conditions may vary with the manufacturing process, and especially with the length of the memory cell. Manufacturing processes do introduce variations in the dimensions of the cell, specifically in those of the polysilicon layers, which affect the value of the drain voltage to be applied.

On the whole, the above considerations indicate that the storage circuit should be provided with a voltage generator which is specially effective and accurate in supplying the bit line with the appropriate drain voltage during the programming phase.

The prior art has already proposed solutions directed to fill this demand. One known solution is based on the principle that basically two voltages are supplied to the storage circuit from outside, namely a supply voltage Vcc of 5 volts and a programming voltage Vpp of 12 volts. It has been common practice to provide the drain voltage by dividing the programming voltage Vpp. In this way, a drain voltage can be obtained which is fairly stable versus temperature and the circuit manufacturing process parameters, although it may vary by ±5% with the programming voltage Vpp. However, during a programming phase the threshold voltage of the cell gradually tends to rise, and the current drawn by the cell decreases over time. Through the resistive divider, the voltage is generated on the basis of a mean value of the programming current, and this regulation cannot give consistently good results.

A second known solution is described in U.S. Pat. No. 5,263,000, whereby the drain voltage is supplied from a voltage booster which is fed the supply voltage Vcc of 5 volts and includes a charge pump circuit controlled by a clock signal. Even this prior approach is not devoid of shortcomings. The output stage, when so configured, has proved high in current consumption, presumably because of a current loss occurring between the booster output and ground. Furthermore, the charge pump circuit, which supplies within one half-period the boosted voltage to an output node of the generator, will leave that node "floating" during the next half-period.

A third known solution proposes to use a clock signal with linear delay propagation to control a plurality of charge pump circuits. However, this approach cannot ensure an appropriate phase shift of the charge pump circuits, and with it, proper performance of the voltage generator.

In addition, the charge pump circuits utilized in the prior art have no limitation on the rise of the internal voltages, which may result in malfunctions of the charge pumps incorporated to the generator.

SUMMARY OF THE INVENTION

A preferred embodiment of the invention is a voltage generator which can constantly output a suitable voltage value to the bit line for optimum programming of the memory cells, while affording savings in terms of current consumption and, therefore, power dissipation; all this being effective to overcome the limitations of current solutions provided by the prior art. The voltage generator generates voltage from a plurality of charge pump circuits which are suitably shifted in phase.

In the preferred embodiment a clock generator of the loop type is used which can vary the clock frequency with variations in a supply voltage, and can drive a plurality of pairs of charge pump circuits through a generator of a plurality of phases each controlling in phase opposition one pair of the charge pump circuits.

The charge pump circuits include a limiter circuit for limiting their internal voltages and monolithically integrated capacitors which utilize interpoly oxide and reduce the integrated circuit area occupied by each charge pump circuit.

DETAILED DESCRIPTION OF THE INVENTION

Figure 1:
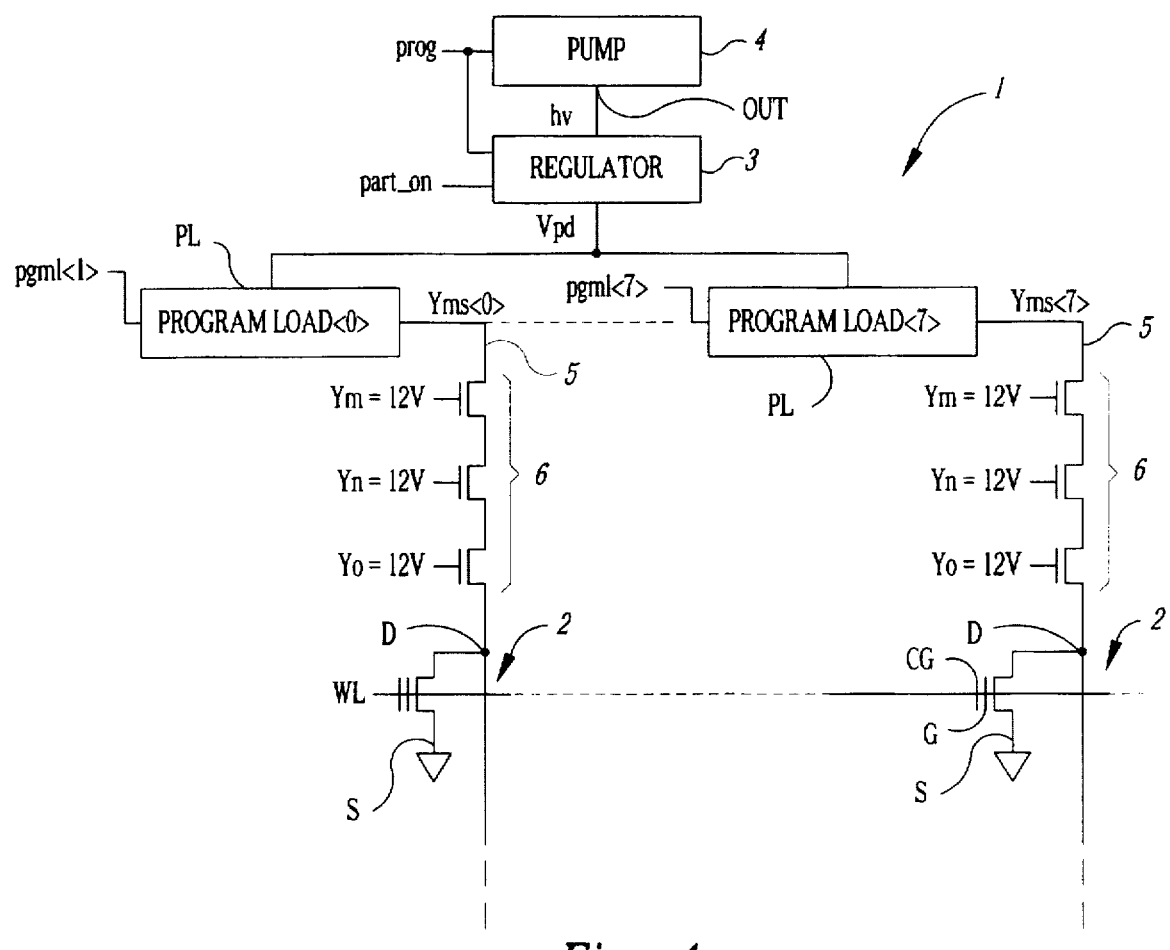
FIG. 1 is a diagrammatic view of a programming circuit which incorporates a voltage generator according to a preferred embodiment of the invention.

A preferred embodiment of the invention is shown in FIG. 1. With reference to FIG. 1, a programming circuit 1 for non-volatile memory cells 2 of an electrically programmable and erasable type, e.g., FLASH cells is shown. The circuit 1 incorporates a voltage generator 4. Each cell 2 is comprised of a MOS transistor having a floating gate G and a further control gate CG. The cells 2 are laid in rows or word lines WL and columns or bit lines 5. The cells of one word line WL have in common the electric line which drives their respective control gates CG, whereas the cells of one bit line 5 have in common their drain terminals D. Shown diagrammatically in FIG. 1 by way of example is a matrix array of cells having 8-bit memory words.

The voltage generator 4 is connected to the bit lines 5 through a regulator 3. Connected between the output of the regulator 3 and each bit line 5 is a program load switch block PL which is controlled by a corresponding signal pgml. The blocks PL receive, output from the regulator 3, a drain voltage Vpd to apply to the bit lines 5. The voltage Vpd is transferred to an output Yms of each block PL when the corresponding bit is to be programmed.

The source terminals S of all the cells 2 are connected to the same voltage reference, e.g., a signal ground GND.

Each bit line 5 further comprises a set of MOS transistors, collectively designated 6, which are serially connected each other for selecting the bit line in which they belong. These transistors are enabled by column decode signals Yo, Yn and Ym which are supplied at 12 volts and applied to the respective gate terminals.

The circuit 1 includes a voltage regulator 3 effective to regulate the drain voltage Vpd of the cells 2 during the cell programming phase. This voltage Vpd is actually applied to the bit line 5 but for a negative-going change of level due to the presence of write selection transistors 6. The regulator 3 is tied operatively to a control signal part-on, while the voltage generator 4 is tied operatively to a control signal PROG.

The operation of the programming circuit I will now be discussed. An initial state is assumed wherein the voltage generator 4 and regulator 3 are off, prior to the start of a programming phase. In this case, the drain voltage Vpd would be held at about 4 volts. Upon the programming phase being started, the signal PROG is brought to the value of the supply Vcc. Thereafter, the simultaneous turning on of the voltage generator 4 and the regulator 3, upon the signal PROG being received, allows the value of the voltage hv being output from the voltage generator 4 to be raised very rapidly. In particular, within about 200 ns, the output from the voltage generator 4 will reach a value (2Vcc) being twice that of the supply voltage and retain that value so long as the drain voltage Vpd remains below the limit value of 5.5 volts. This situation is maintained until the voltage Vpd drops below 5.8 volts. During the next phase, when the voltage Vpd remains in the 5.5 to 5.8 volts range, the current flowing through the memory cells 2 will bring the voltage Vpd back toward 5.5 volts.

During the initial programming transient just described, the current consumption of the memory cells 2 is at its maximum. At the end of such a transient, the current drawn by the cells 2 decreases as the cells are being programmed. This causes the working point of the voltage generator 4 to shift toward higher values of the output voltage hv throughout the programming pulse duration. The changes of hv are tracked so as to hold the value of Vpd constant. The programming pulse is ended by the program load blocks PL being turned off to remove the voltage Vpd from the drain terminals of the cells. The cycle is completed with the voltage generator 4 and the regulator 4 turning off.

Figure 2:
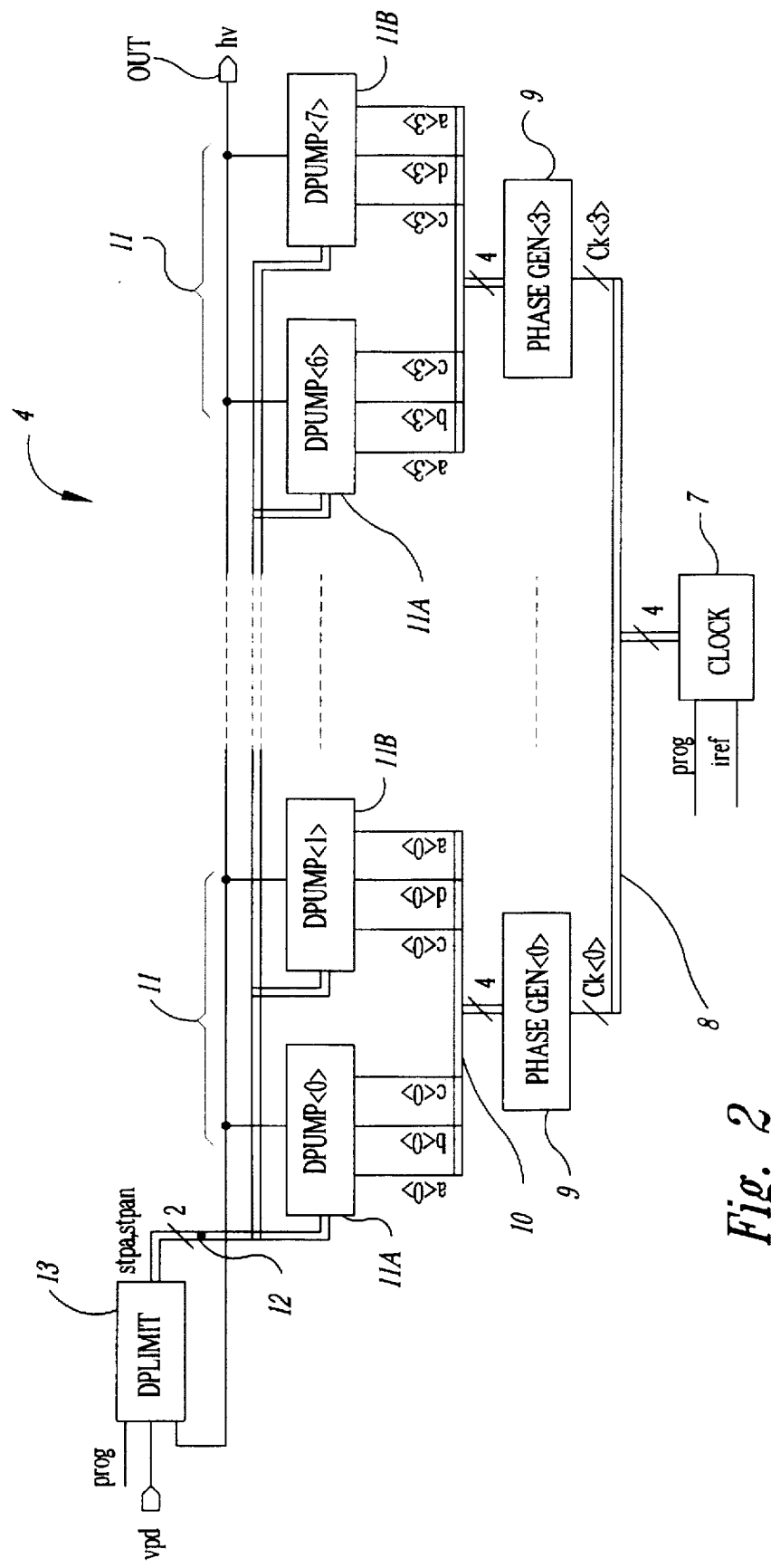
FIG. 2 is a diagrammatic view of a voltage generator according to a preferred embodiment of the invention.

The structure of the voltage generator 4 is shown diagrammatically in FIG. 2 and it includes a clock generator 7 which receives, on a first input, the control signal PROG, and on a second input, a reference current Iref, to output four clock signals ck<0>, ck<1>, ck<2> and ck<3> having the same frequency and being suitably shifted in phase by one eighth of a period. These four clock signals are connected, through a bus 8, to four generators 9 of first A, second B, third C and fourth D phase signals. Each phase generator 9 is, in turn, connected through a further bus 10 to a pair 11 of charge pump circuits. Two of the four phase generators 9 are shown in FIG. 2, the other two indicated schematically as being located between the dashed lines. More generally, any suitable number of phase generators 9 and pairs of charge pump circuits 11 may be employed according to a preferred embodiment of the invention.

Each pair 11 of charge pump circuits comprises a first 11A and a second 11B charge pump circuit. The first charge pump circuit 11A is input the first A, second B and third C phase signals, whereas the second charge pump circuit 11B is input the third C, fourth D and first A phase signals. The first 11A and second 11B charge pump circuits each have a respective input connected, through a bus 12, to an output of a limiter circuit 13, while a respective output thereof is connected to an output terminal OUT of the voltage generator 4. The limiter circuit 13 has a first input connected to the output terminal OUT of the voltage generator 4, and is input the drain voltage Vpd and the control signal PROG.

The operation of the voltage generator 4 will now be explained. Advantageously, the phase signals A, B, C and D are suitably disoverlapped such that the first 11A and second 11B charge pump circuits will be operated in phase opposition, that is, such that when the circuit 11A is on, the other circuit 11B will be off, and vice versa. By having eight pump circuits driven by clock signals which are suitably shifted in phase, the ripple present on each of the charge pump circuits can be minimized, since only four of the eight charge pumps will be on at any given time of the voltage generator 4 operation. The four pumps are simultaneously active on the output terminal OUT, thereby preventing it from entering a floating state as was the case with conventional circuits. In addition, the voltage generator further includes a limiter circuit 13 to limit the internal voltages of the charge pump circuits 11, thereby ensuring proper operation. In this way, a value of the voltage hv is obtained on the output terminal OUT which can drive, through the regulator 3, the drain terminals of the memory cells 2 during the programming phase.

Figure 3:
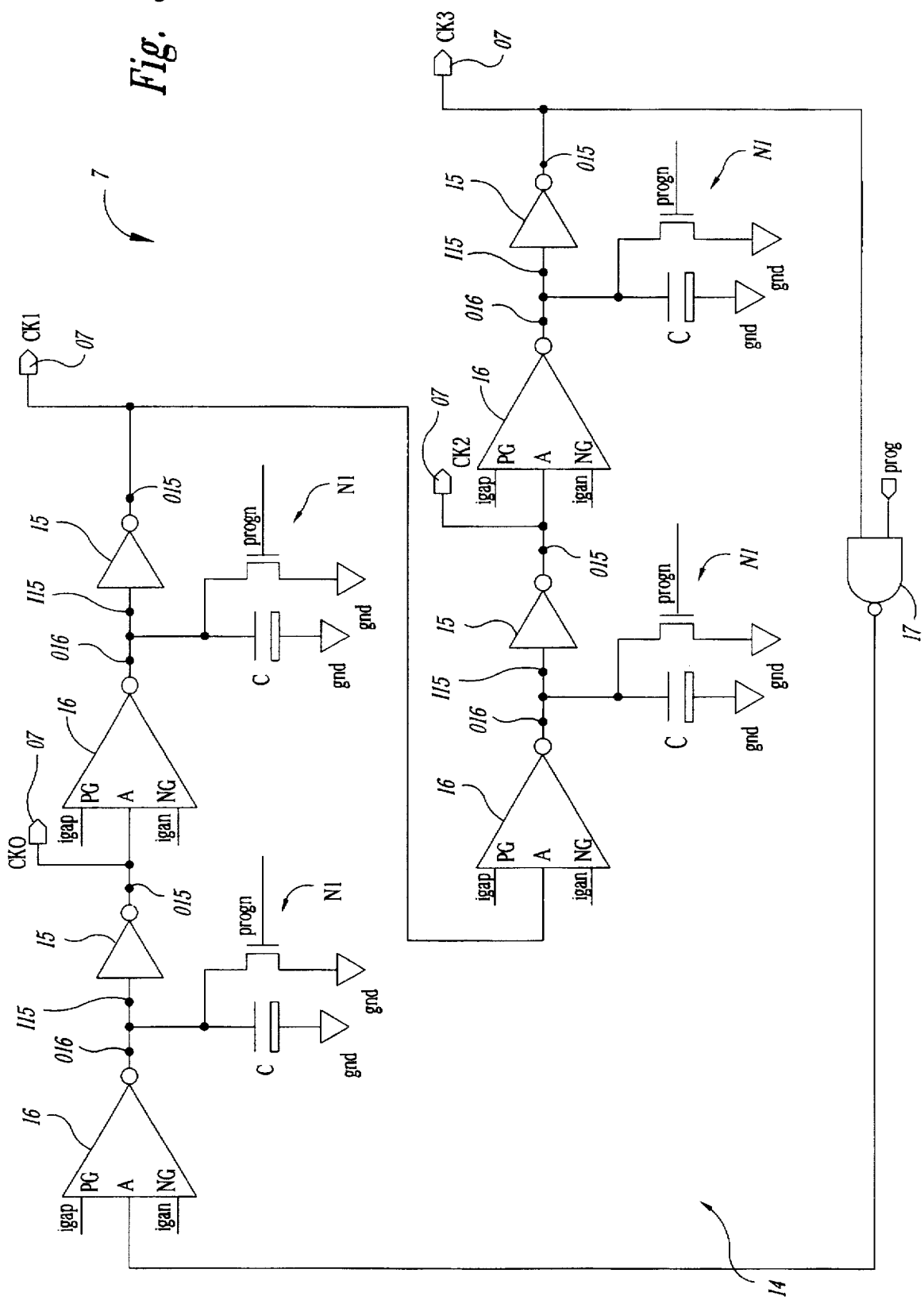
FIG. 3 is a diagrammatic view of a clock generator incorporated in the voltage generator according to a preferred embodiment of the invention.

The structure of the clock generator 7 is shown in FIG. 3. Advantageously, this generator 7 is of the loop type. The clock generator 7 comprises a loop 14 of primary inverters 15 having an input terminal I15 connected to an output terminal O16 of a secondary inverter 16, preceding the inverter 15 in the loop 14, and to the ground reference GND through the parallel of an n-channel MOS transistor N1 and a capacitor C, and having an output terminal O15 connected to an input A of the secondary inverter 16 that follows the inverter 15 in the loop 14 and to an output terminal O7 of the clock generator 7. The clock generator 7 supplies, at the output terminals O7, the clock signals ck<0>, ck<1>, ck<2> or ck<3> suitably shifted in phase by one eighth of a period by reason of the inverter loop 14 provided. The loop 14 also comprises a logic gate 17 of the NAND type having a first input connected to the output terminal O15 of an inverter 15, and an output connected to the input A of a secondary inverter 16. The logic gate 17 is input the control signal PROG. Each secondary inverter 16 receives, on further inputs PG and NG, a pair of signals IGAP/IGAN generated by a reference circuit 18. Advantageously, the signal IGAN corresponds to the negated signal IGAP. Further, each transistor N1 is driven through its control terminal by a negated control signal PROGN being the negation of the control signal PROG.

Figure 4:
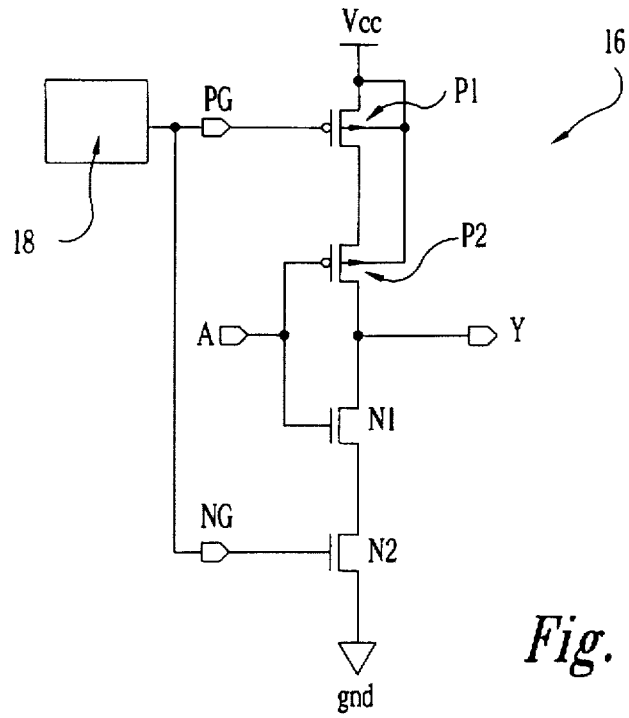
FIG. 4 is a diagrammatic view of an inverter included in the clock generator of FIG. 3 according to a preferred embodiment of the invention.

The circuit configuration of the secondary inverters 16 is shown in FIG. 4. Each secondary inverter 16 basically comprises first P1 and second P2 MOS transistors of the P-channel type, as well as third Ni and fourth N2 MOS transistors of the n-channel type, which are serially connected to each other between the supply voltage reference Vcc and the ground GND. The P-channel transistors P1 and P2 have their body terminals connected together and to the supply voltage reference Vcc. Also, the second P2 and third N1 transistors have their control terminals connected together to form the input A of the secondary inverter 16, which is connected to the output O15 of an inverter 15 in the loop 14 of the clock generator 7. The control terminals of the first P1 and fourth N2 transistors form, on the other hand, the second PG and third NG inputs of the secondary inverter 16 and are connected to the reference circuit 18. The drain terminals of the second P2 and third N1 transistors, being connected together, form the output O16 of the secondary inverter 16, which output is connected to the input I15 of an inverter 15.

Figure 5:
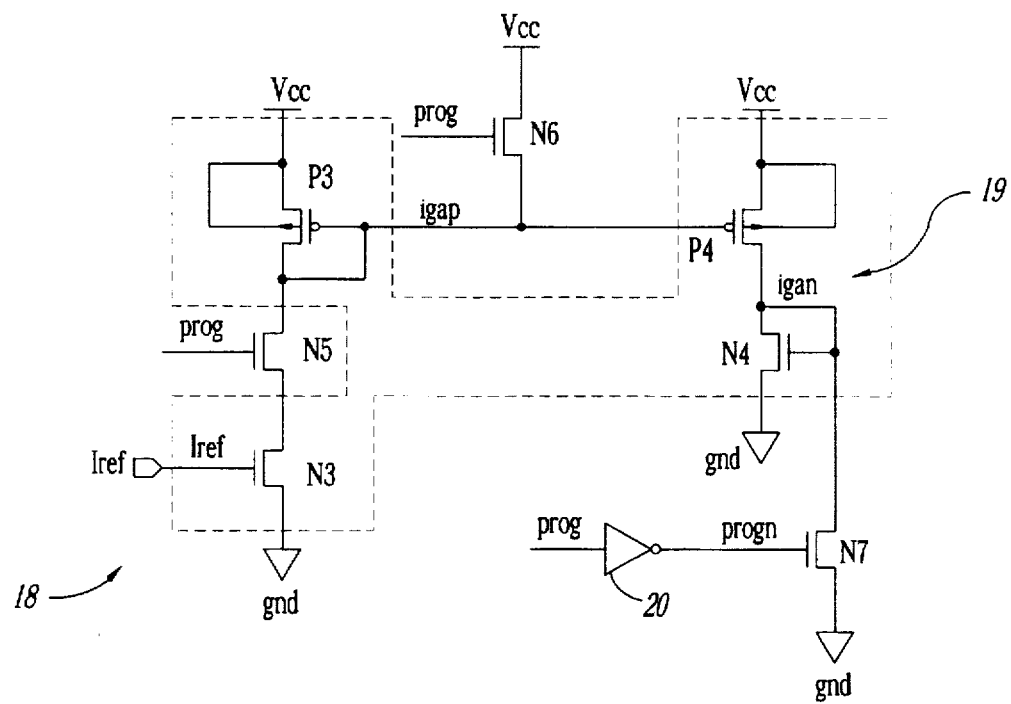
FIG. 5 is a diagrammatic view of a reference circuit shown in FIG. 4 according to a preferred embodiment of the invention.

The reference circuit 18, having the structure shown in FIG. 5, comprises a current mirror 19 connected between the supply voltage reference Vcc and the ground GND and being driven by a reference current signal Iref supplied from a generator, not shown in the Figure because such generators are conventional. The reference current Iref utilized should be constant with respect to the changes of the temperature and the value of the supply voltage Vcc. The current mirror 19 comprises a first MOS transistor N3 of the n-channel type which is controlled, through its control terminal, by the current Iref and connected between a second MOS transistor P3 of the p-channel type and the ground GND. The second transistor P3 is diode-like configured, i.e., it has its drain and control terminals connected together, and has its source and body terminals connected to each other and to the supply voltage reference Vcc. The current mirror 19 further comprises a third MOS transistor P4 of the p-channel type having its source and body terminals connected together and to the supply voltage reference Vcc, its control terminal connected to the control terminal of the second transistor P3, and its drain terminal connected to the ground GND through a fourth MOS transistor N4 of the n-channel type. The fourth transistor N4 has its source and control terminals connected together.

The reference circuit 18 further comprises first N5, second N6 and third N7 MOS enabling transistors, all of the n-channel type. The first enabling transistor N5 is connected between the first N3 and the second P3 mirror transistor, and receives the control signal PROG on its control terminal. The second enabling transistor N6 is connected between the control terminals of the second P3 and third P4 mirror transistors and the supply voltage reference Vcc. The second transistor N6 also receives the control signal PROG on its control terminal. The third enabling transistor N7 is connected between the common control and drain terminals of the fourth mirror transistor N4 and the ground GND, and receives, on its control terminal, the control signal PROGN being the logic negation of the control signal PROG as obtained through an inverter 20. The current signal present on the control terminals of the second P3 and third P4 mirror transistors is the same as the signal IGAP present on the input PG of the secondary inverters 16; likewise, the current signal present on the control terminal of the fourth mirror transistor N4 is the same as the negated signal IGAN.

The mode of operation of the clock generator 7 according to the invention will be discussed next. Each charge pump circuit 11 may be modelled as a generator of a voltage which carries the following value:

$$n*(Vcc-Vt) \quad (1)$$

in series with a resistor with the following value:

$$n/C*f \quad (2)$$

where, n is the number of stages making up each individual charge pump circuit,

Vt is the threshold voltage value of a MOS transistor of the n-channel type,

C is the value of the equivalent capacitor of each charge pump stage, and f is the frequency of the phase signals, i. e., the clock frequency.

The clock generator 7 is adapted to hold, for a given load, the output voltage from a charge pump circuit constant as the supply voltage Vcc varies, by varying the clock frequency f proportionally with the variations of the voltage Vcc. In fact, each primary inverter 15 has a switch threshold value which is one half the supply voltage Vcc (Vcc/2), while the secondary inverters 16 place a constant current charge/discharge phase on the output capacitor C, because of the transistor N1 being in parallel with the capacitor C. Thus, as the supply voltage Vcc decreases, less time is needed to switch the inverters 15 located downstream from the capacitor C, resulting in a desired increase of the clock frequency f By the same rationale, as the supply voltage Vcc increases, the frequency f decreases.

Figure 6A:
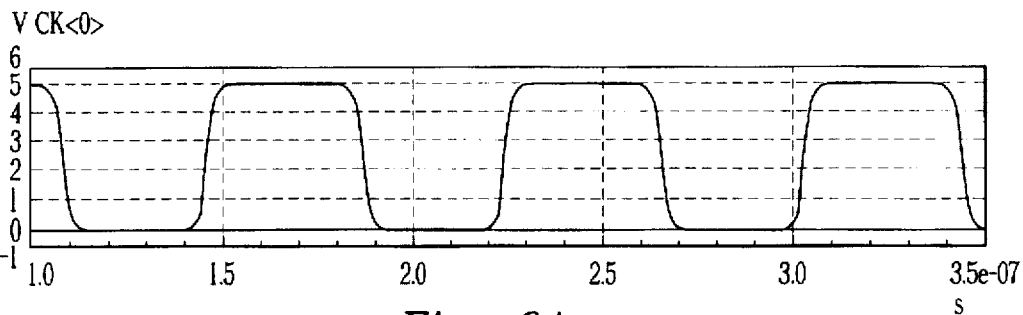
FIGS. 6A to 6E are plots of respective signal patterns obtained from the clock generator shown in FIG. 3.
Figure 6B:
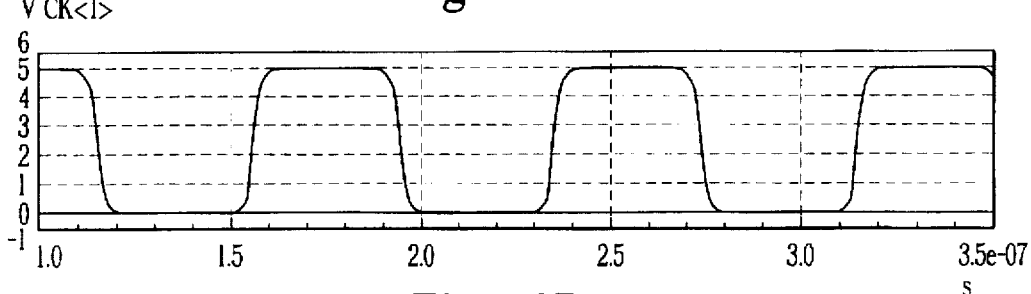
Figure 6C:
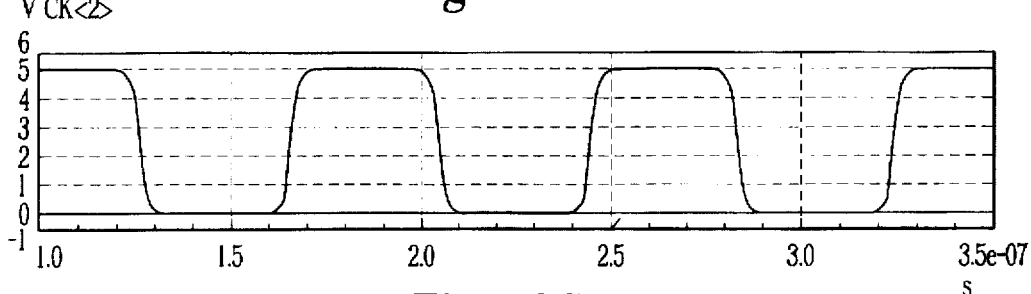
Figure 6D:
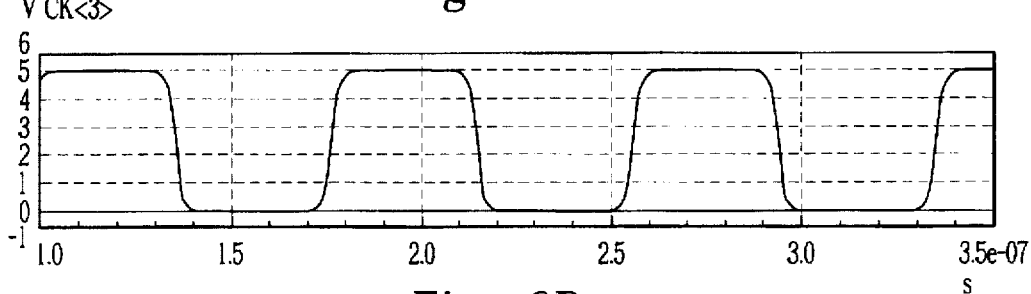
Figure 6E:
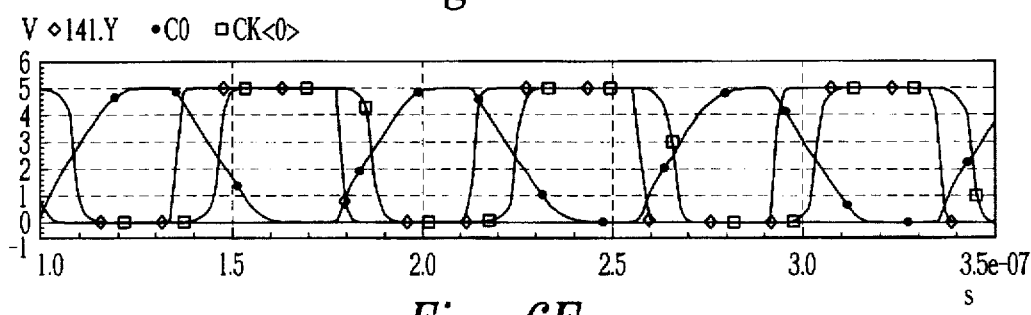

Plotted in FIGS. 6A to 6D are the clock signals, to be obtained with the clock generator 7, which have the same frequency but are suitably shifted in phase by one eighth of a period. FIG. 6E shows the patterns of the charge/discharge voltages for a capacitor C of the clock generator 7, in overlapped relationship to a phase-shifted clock signal.

Figure 7:
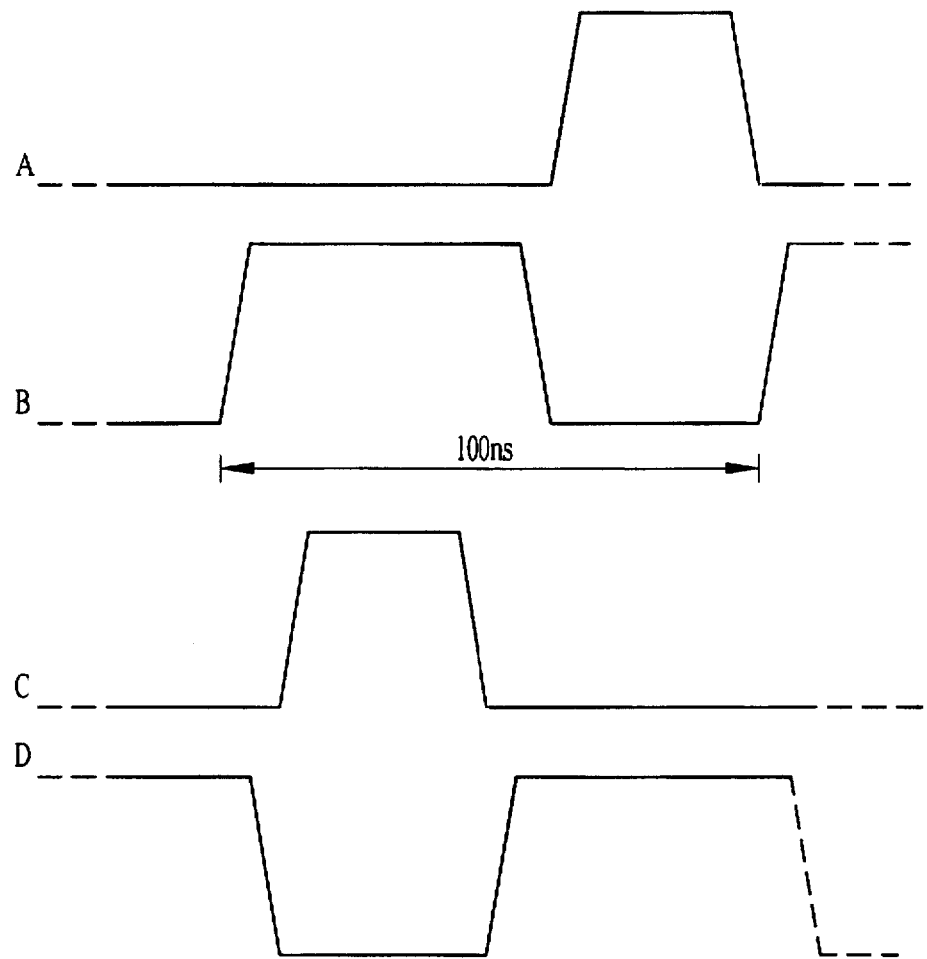
FIG. 7 is a plot of the ideal pattern for phase signals suitable to control pairs of pump circuits contained in the voltage generator according to a preferred embodiment of the invention.

From the clock signals ck<0>, ck<1>, ck<2> or ck<3>, the phase generator 9 can provide four phase signals A, B, C and D effective to drive, in opposite phases, the pairs 11 of charge pump circuits. The ideal pattern for these phase signals is shown in FIG. 7. By way of example only, the period of the phase signals has been set at 100 ns. The phase signals shown in FIG. 7 are provided by the phase generator 9 illustrated in detail by FIG. 8. The phase generator 9 has an input terminal 19, which receives the clock signal ck, and four output terminals OA, OB, OC and OD which supply the phase signals A, B, C and D. The output terminals OA, OB, OC and OD are respectively connected to the output terminals of first 21, second 22, third 23 and fourth 24 output logic inverters. The input terminal I9 is connected to a first circuit node X1 through a series of first 25 and second 26 input logic inverters. The first circuit node X1 is connected to the output terminals OA, OB, OC and OD through first 27, second 28, third 29 and fourth 30 circuit legs, respectively.

The first circuit leg 27 comprises a first logic gate 31 of the NOR type having an input connected to the circuit node X1 and being serially connected to a logic inverter 32, in turn connected to the first output terminal OA through the output logic inverter 21. The logic inverter 32 outputs a first feedback signal GATE-A, and is connected to the second circuit leg 28 which comprises a first logic gate 33 of the AND type connected with its output to a first input of a second logic gate 34 of the NOR type, in turn connected to the second output terminal OB through a series of two logic inverters 35, 36 and of the output logic inverter 22.

The logic gate 33 has a first input connected to the first circuit leg 27, and a second input connected to the circuit node X1. The logic inverter 36 outputs a second feedback signal GATE-B, and is connected, through a first feedback logic inverter 37, to the first circuit leg 27, specifically to a further input of the logic gate 31, and through a second feedback logic inverter 38, to the fourth circuit leg 30.

The third circuit leg 29 comprises a logic NAND gate 39 having a first input connected to the circuit node X1 and a second input connected, through the output logic inverter 24, to the fourth output terminal OD. The logic gate 39 outputs a third feedback signal GATE-C, and is connected to the fourth circuit leg 30 through a third feedback logic inverter 40.

The fourth circuit leg 30 comprises a first logic AND gate 41 having its output connected to a first input of a second logic gate 42 of the NOR type, in turn connected to the fourth output terminal OD through a logic inverter 43. The logic gate 41 has a first input connected to the circuit node X1, and a second input connected, through the feedback logic inverter 38, to the second output terminal OB. The logic inverter 43 outputs a fourth feedback signal GATE-D, and is connected to the second circuit leg 28, specifically to a further input of the logic gate 34, and the third circuit leg 29, specifically to a second input of the logic gate 39.

Figure 8:
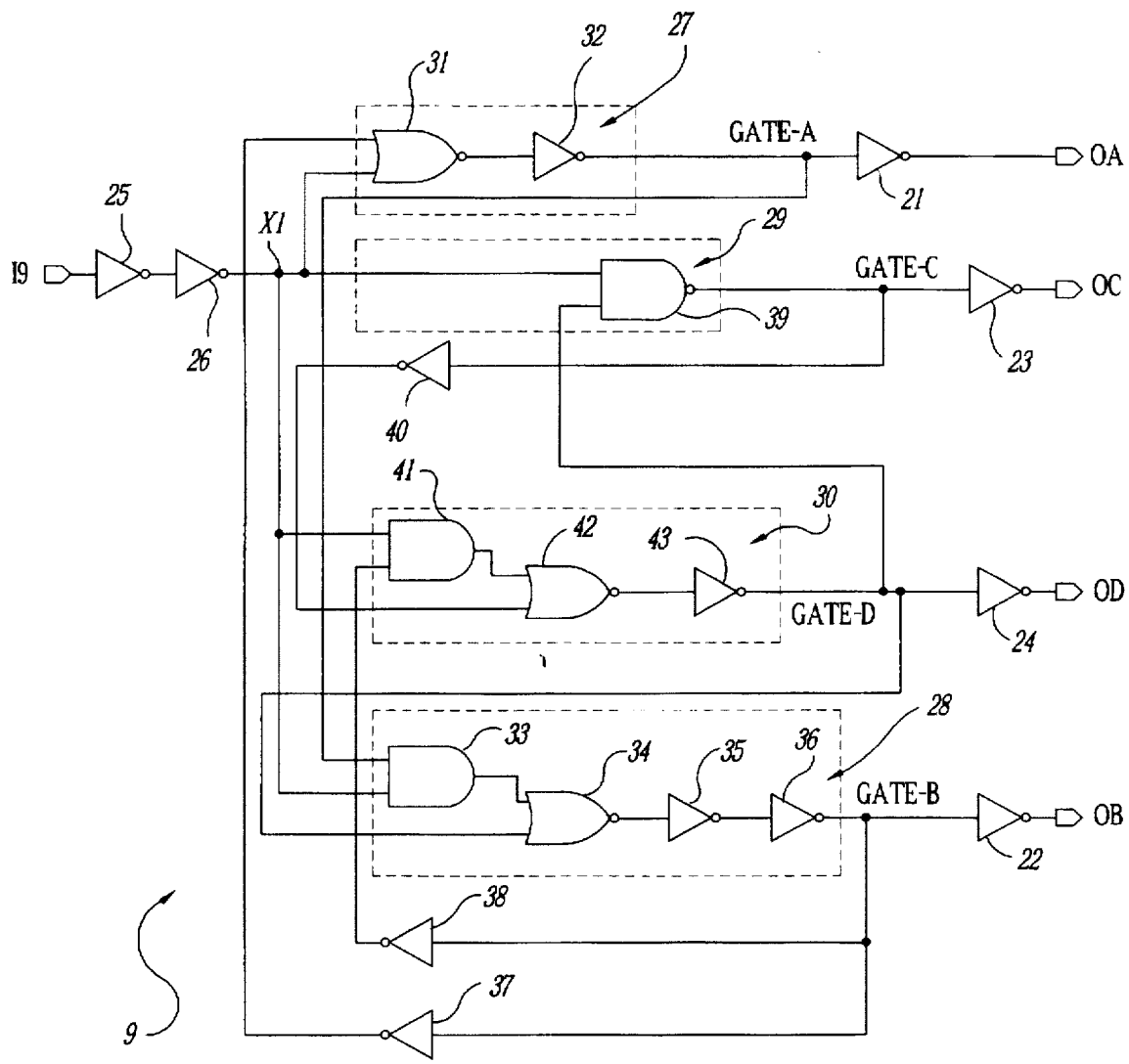
FIG. 8 is a diagrammatic view of a phase generator included in the voltage generator according to a preferred embodiment of the invention.

The phase generator 9 of FIG. 8 can provide the following switching sequences, at the front and descending edges of the clock signal ck:

| ck: 0 → 1 | A: 1 → 0 | B: 0 → 1 | D: 1 → 0 | C: 0 → 1 |
|---|---|---|---|---|
| ck: 1 → 0 | C: 1 → 0 | D: 0 → 1 | B: 1 → 0 | A: 0 → 1 |

Figure 9A:
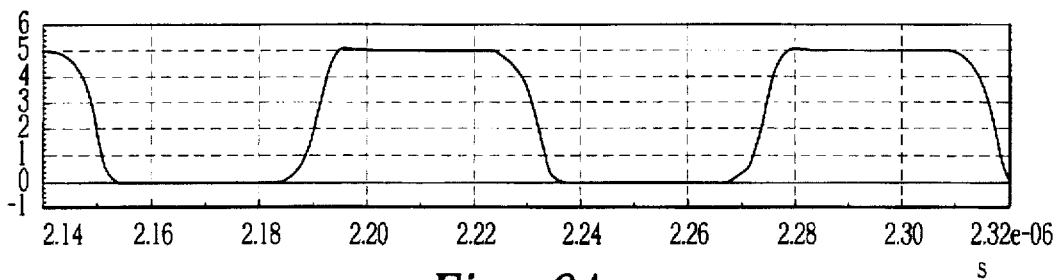
FIGS. 9A to 9E are plots of respective phase signal patterns obtained from the phase generator shown in FIG. 8 according to a preferred embodiment of the invention.
Figure 9B:
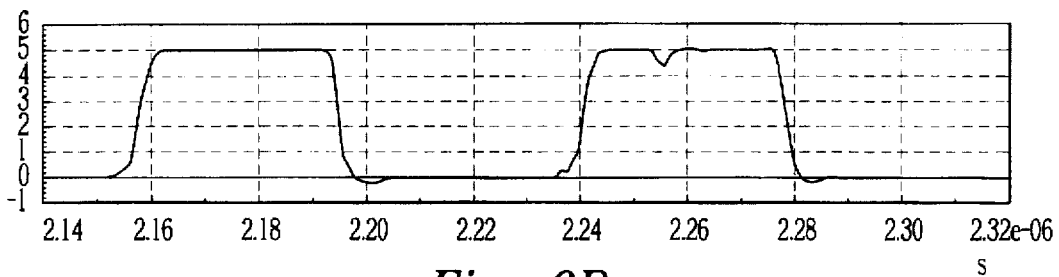
Figure 9C:
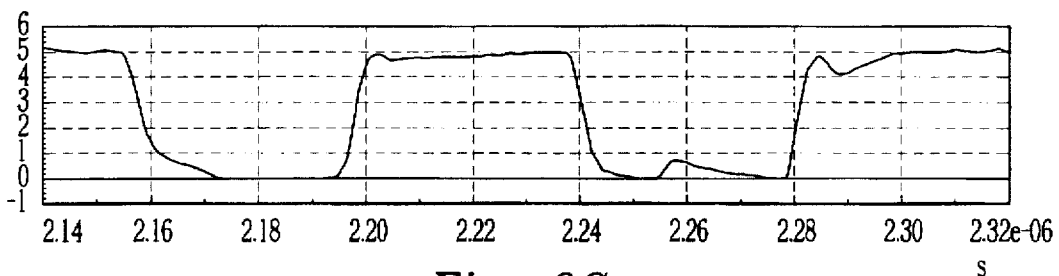
Figure 9D:
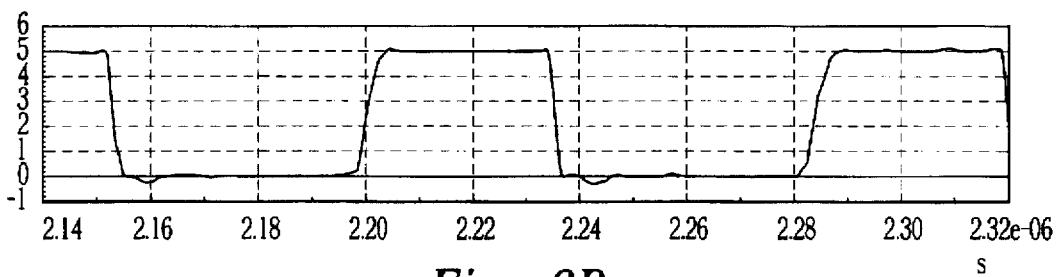
Figure 9E:
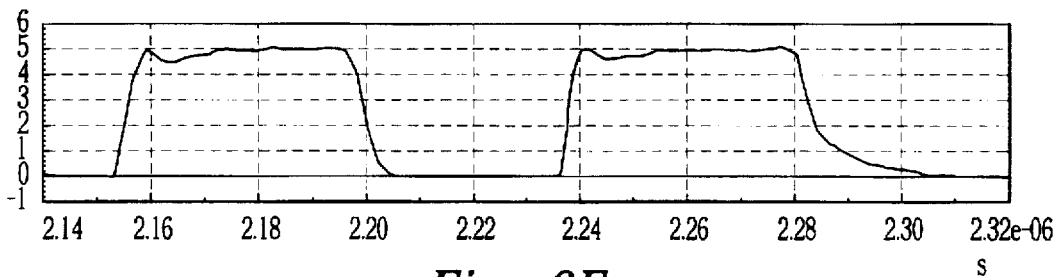

Thus, the phase signals A, B, C and D are provided whose patterns, as obtained from simulations upon the occurrence of the clock signal shown in FIG. 9A, are plotted in FIGS. 9B to 9E. Advantageously, the signals which produce the switchings at the front and descending edges of the clock signal ck are, according to the invention, the feedback signals GATE-A, GATE-B, GATE-C and GATE-D, not the phase signals A, B, C and D in any direct fashion. In this way, the fairly high current peaks that the phase signals are liable to develop during the programming phase of the memory cells 2 are prevented from causing undesired switching of following phase signals.

Figure 10:
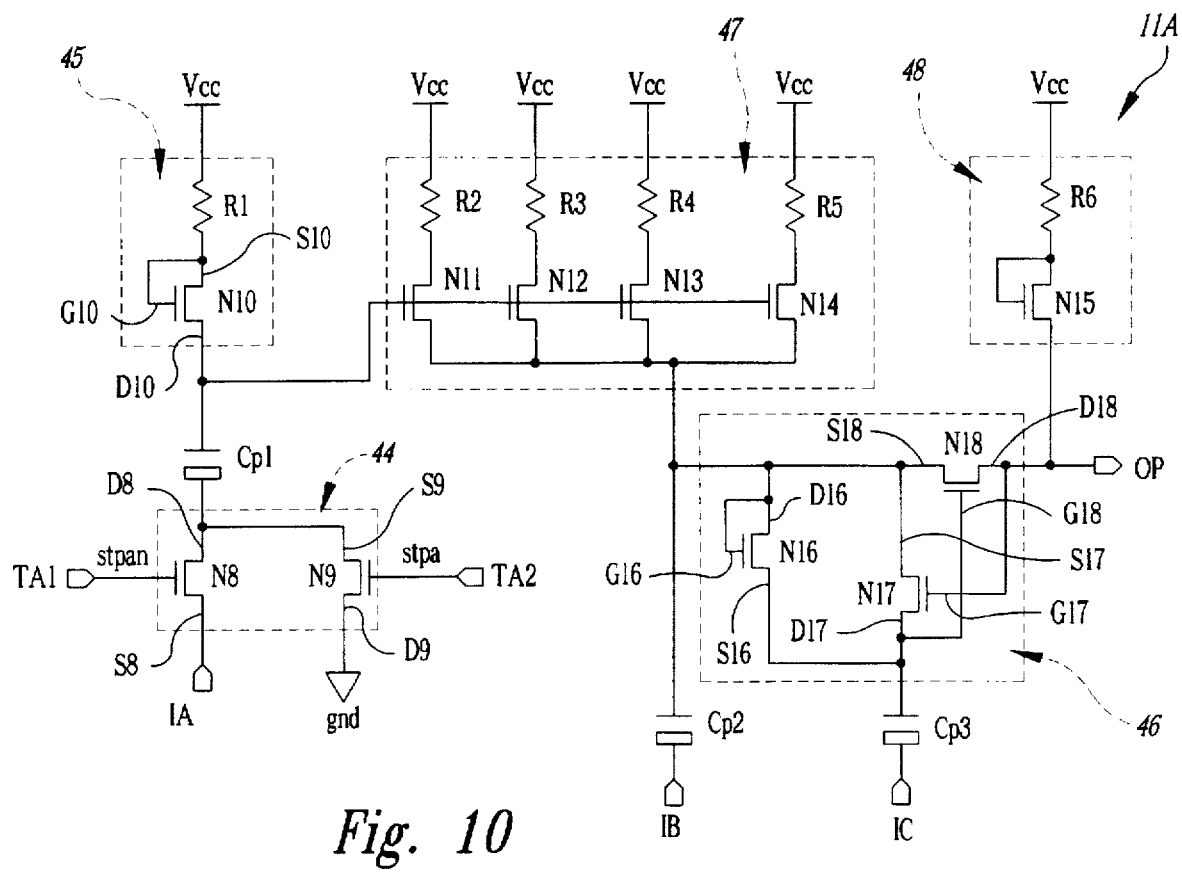
FIG. 10 is a diagrammatic view of a charge pump circuit included in the voltage generator according to a preferred embodiment of the invention.

Shown in FIG. 10 is a charge pump circuit, such as 11A, incorporated in the voltage generator 4. The charge pump circuit 11A has a first input terminal IA arranged to receive the first phase signal A from the phase generator 9. The first input terminal IA is connected to the supply voltage reference Vcc through a series of an enabling circuit 44, a first pump capacitor Cp1 and a first biasing circuit 45. This first enabling circuit 44 comprises a parallel connection of first N8 and second N9 MOS transistors of the n-channel type whose control terminals form first TA1 and second TA2 enabling terminals of the enabling circuit 44. According to an advantageous aspect, the first enabling terminal TA1 receives an enabling signal STPAN which is the logic negation of an enabling signal STPA input to the second enabling terminal TA2. The transistor N8 has its source terminal S8 connected to the input terminal IA, and its drain terminal D8 connected to the first pump capacitor Cp1 and the source terminal S9 of the transistor N9, the latter having its further drain terminal D9 connected to the ground GND.

The biasing circuit 45 comprises a further MOS transistor N10 of the n-channel type having its drain terminal D10 connected to the first pump capacitor Cp1 and its source S10 and control G10 terminals connected together and to the supply voltage reference Vcc through a first biasing resistor R1.

The charge pump circuit 11A also has a second input terminal IB, which receives the second phase signal B from the phase generator 9 and is connected to an output terminal OP of the charge pump circuit 11A through a series of a second pump capacitor Cp2 and a decoupling circuit 46. Likewise, the charge pump circuit 11A further includes a third input terminal IC, which receives the third phase signal C from the phase generator 9 and is connected to the decoupling circuit 46 through a third pump capacitor Cp3.

The output terminal OP is further connected to the supply voltage reference Vcc through a parallel connection of second 47 and third 48 biasing circuits.

The biasing circuit 47 comprises first N11, second N12, third N13 and fourth N14 MOS transistors of the n-channel type which have their drain terminals in common and connected to the decoupling circuit 46, their control terminals in common and connected to the first pump capacitor Cp1, and their source terminals connected to the supply voltage reference Vcc through first R2, second R3, third R4 and fourth R5 biasing resistors. The biasing circuit 48 comprises a further MOS transistor N15, also of the n-channel type, which has its drain terminal connected to the output terminal OP of the charge pump circuit 11A and its control and source terminals connected together and to the supply voltage reference Vcc through a further biasing resistor R6.

The decoupling circuit 46 comprises first N16, second N17 and third N18 MOS transistors of the n-channel type. The first transistor N16 has its control G16 and drain D16 terminals connected together and to the source terminal S17 of the second transistor N17, as well as to the source terminal S18 of the third transistor N18 and to the second pump capacitor Cp2. The transistor N16 also has its source terminal S16 connected to the drain terminal D17 of the second transistor N17 and to the control terminal G18 of the third transistor N18, as well as to the third pump capacitor Cp3.

The second transistor N17 has its control terminal G17 connected to the drain terminal D18 of the third transistor N18, in turn connected to the output terminal OP of the charge pump circuit 11A.

Figure 11A:
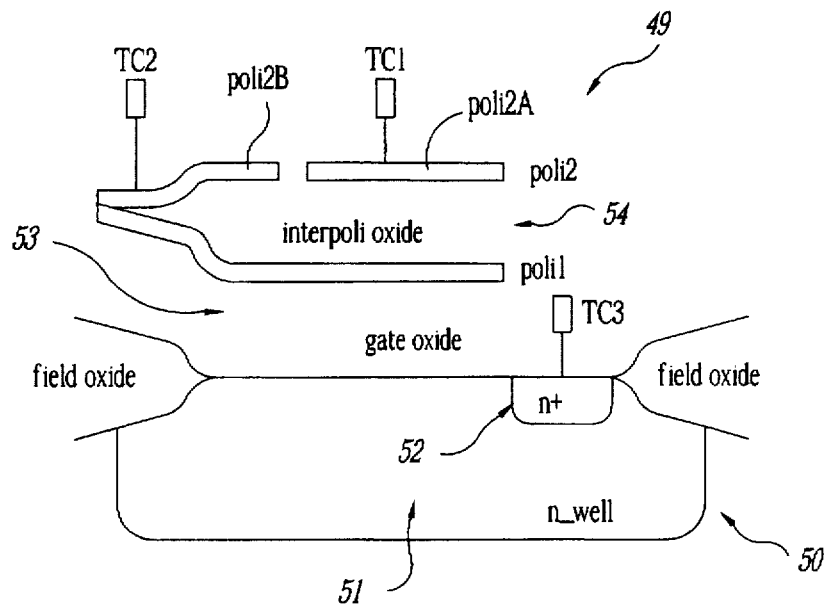
FIG. 11A is a cross-sectional view of an integrated circuit on which a three-terminal capacitor has been formed, the capacitor being included in the charge pump circuit of FIG. 10 according to a preferred embodiment of the invention.

Advantageously, the pump capacitors Cp1, Cp2, and Cp3 are provided with three terminals by using the interpoly oxide with an integrated structure 49, as shown in FIG. 11A. The structure 49 comprises a semiconductor substrate 50 with a dopant of a first type, e.g., of the P type, wherein an epitaxial well 51 has been formed using a second type N of dopant. Formed inside the epitaxial well 51, as by implantation followed by diffusion of dopant, is a first diffused region 52 which has a higher concentration of the second-type dopant $N^+$ than the well 51. Deposited over the epitaxial well 51 is an oxide layer 53, referred to as the gate oxide, which is, in turn, covered by a first layer of polycrystalline silicon, POLY1. Deposited likewise over the first layer POLY1 is an oxide layer 54, referred to as the interpoly oxide, which is also covered with a second layer of polycrystalline silicon, POLY2.

Advantageously, said second layer POLY2 is made up, according to the invention, of first POLY2A and second POLY2B portions which are structurally independent and separated one from the other. The first portion POLY2A comprises a first contact terminal TC1. The second portion POLY2B advantageously is in direct contact with the first polycrystalline silicon layer POLY1, and has a second contact terminal TC2. It is the second polysilicon layer, in fact, that can only be subjected to the metallization phase resulting in the formation of the contact terminals. Thus, the second contact terminal TC2 will be separate from the first contact terminal TC1. Lastly, the diffused region 52 includes a third contact terminal TC3.

The integrated structure 49 appears, therefore, in a double capacitor C1–C2 form. In fact, the presence of a first capacitor C1 comprised of the layers POLY1 and POLY2A which form the conductive plates, and that of the interpoly oxide layer 54, forming the dielectric between the plates, can be discerned therein. Likewise, a second capacitor C2, comprised of the first layer POLY1 and the epitaxial well 51 forming its plates, and the dielectric consisting of the gate oxide layer 53, can be observed.

Figure 11B:
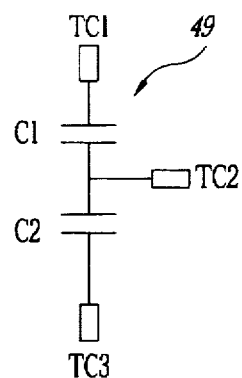
FIG. 11 B is a diagrammatic view of an equivalent circuit of the capacitor shown in FIG. 11 A according to a preferred embodiment of the invention.

Shown in FIG. 11B is the equivalent circuit of the double capacitor C1–C2 thus obtained. The provision of three contact terminals allows convenient connection of the capacitors C1 and C2 in either series or parallel. The integrated structure 49 also affords considerable savings in space, for a given capacitive value, compared to conventional capacitors formed by using the epitaxial well of the $N^+$ type alone. Particularly advantageous in terms of occupied area is the parallel configuration of the double capacitor provided by an integrated structure 49. Practical tests carried out by the Applicant have shown that the savings in semiconductor area to be obtained with these double capacitors can amount to approximately 35% of the area required by conventional structures. A connection of the parallel type is used in the charge pump circuit 11A of this invention to provide the pump capacitors Cp1, Cp2 and Cp3.

Figure 12:
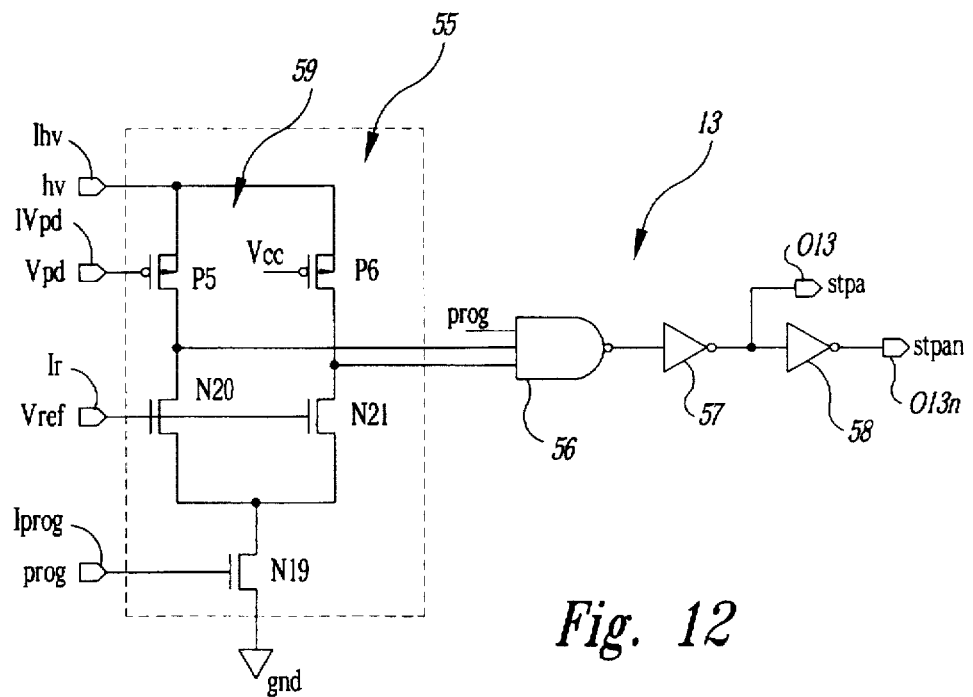
FIG. 12 is a diagrammatic view of a limiter circuit included in the voltage generator according to a preferred embodiment of the invention.

Advantageously, the enabling signals STPA and STPAN for the enabling circuit 44 of the pump circuit in FIG. 10 are supplied, according to the invention, by a limiter circuit 13, shown in detail in FIG. 12. The limiter circuit 13 has first Ihv, second Ivpd, third Ir and fourth Iprog inputs which respectively receive the regulating voltage hv, drain programming voltage Vpd, reference voltage Vref, and control PROG signals. The limiter circuit 13 also has first O13 and second O13n output terminals which supply the enabling signals STPA and STPAN to each charge pump circuit 11A, 11B. The input terminals Ihv, Ivpd, Ir and Iprog are connected to the first output terminal O13 through a series of an input stage 55, a logic gate 56, and a first logic inverter 57. The first logic inverter 57 is, in turn, connected to the second output terminal O13n through a second logic inverter 58.

The logic gate 56 has a first input terminal receiving the control signal ROG, and second and third input terminals which are connected to the input stage 55. This input stage 55 comprises a comparator 59, connected to the input Ihv and to a ground GND through a MOS transistor N19 of the n-channel type, whose control terminal forms the fourth input Iprog and receives the control signal PROG. The comparator 59 comprises a series of first P5 and second N20 MOS transistors of the p-channel and the n-channel type, respectively, as well as a series of third P6 and fourth N21 MOS transistors, also of the p-channel and the n-channel type, respectively. The transistors P5 and P6 have their drain terminals connected together and to the first input Ihv, whereas the transistors N20 and N21 have their source terminals connected together and to the drain terminal of the transistor N19. In addition, the transistors N20 and N21 have a common control terminal forming the third input Ir and being connected to the reference voltage Vref. The control terminal of the transistor P5 provides the second input terminal Ivpd and receives the drain programming voltage Vpd, whereas the control terminal of the transistor P6 receives the supply voltage Vcc. The source terminal of the transistor P5 is connected to the drain terminal of the transistor N20 and to the second input terminal of the logic gate 56. Likewise, the source terminal of the transistor P6 is connected to the drain terminal of the transistor N21 and to the third input terminal of the logic gate 56.

The operation of the limiter circuit 13 will now be discussed. A first circuit leg consisting of the first P5 and second N20 transistors controls a first voltage difference $\Delta 1$, between the regulating voltage hv and the drain programming voltage Vpd (held by the regulator 3 at a value of about 5.5 volts). Upon the first voltage difference $\Delta 1$ exceeding a value of 2 volts, ie., when the load current required by the cells is small, the limiter circuit 13 is turned on. This may occur whenever a single bit in a memory word of 8 bits is to be programmed, as shown in the example. A second circuit leg consisting of the third P6 and fourth N21 transistors controls, in a similar manner, a second voltage difference $\Delta 2$, between the regulating voltage hv and the supply voltage Vcc. According to an advantageous aspect, only when the second voltage difference $\Delta 2$ exceeds 2 volts, i.e., only when the regulating voltage hv becomes higher than the supply voltage Vcc, is the limiter circuit 13 enabled.

In this way, undesired actions of the limiter circuit 13 can be prevented during the initial transients when the regulating voltage hv rises much faster than the drain programming voltage Vpd. Thus, the limiter circuit 13 of the preferred embodiment becomes active only upon the regulating voltage hv exceeding both the drain programming voltage Vpd and the supply voltage Vcc by 2 volts. In this case, the enabling signals STPA and STPAN take the logic values of one and zero, respectively, and block the incoming first phase signal (A in the example of FIG. 10) of the charge pump circuit. Accordingly, the second pump capacitor Cp2 will be charged up to a voltage value of Vcc−2Vt, Vt being the threshold voltage value for an n-channel MOS transistor, so as to limit the range of the regulating voltage hv to Vcc+(Vcc−2Vt) as a maximum.

Figure 13:
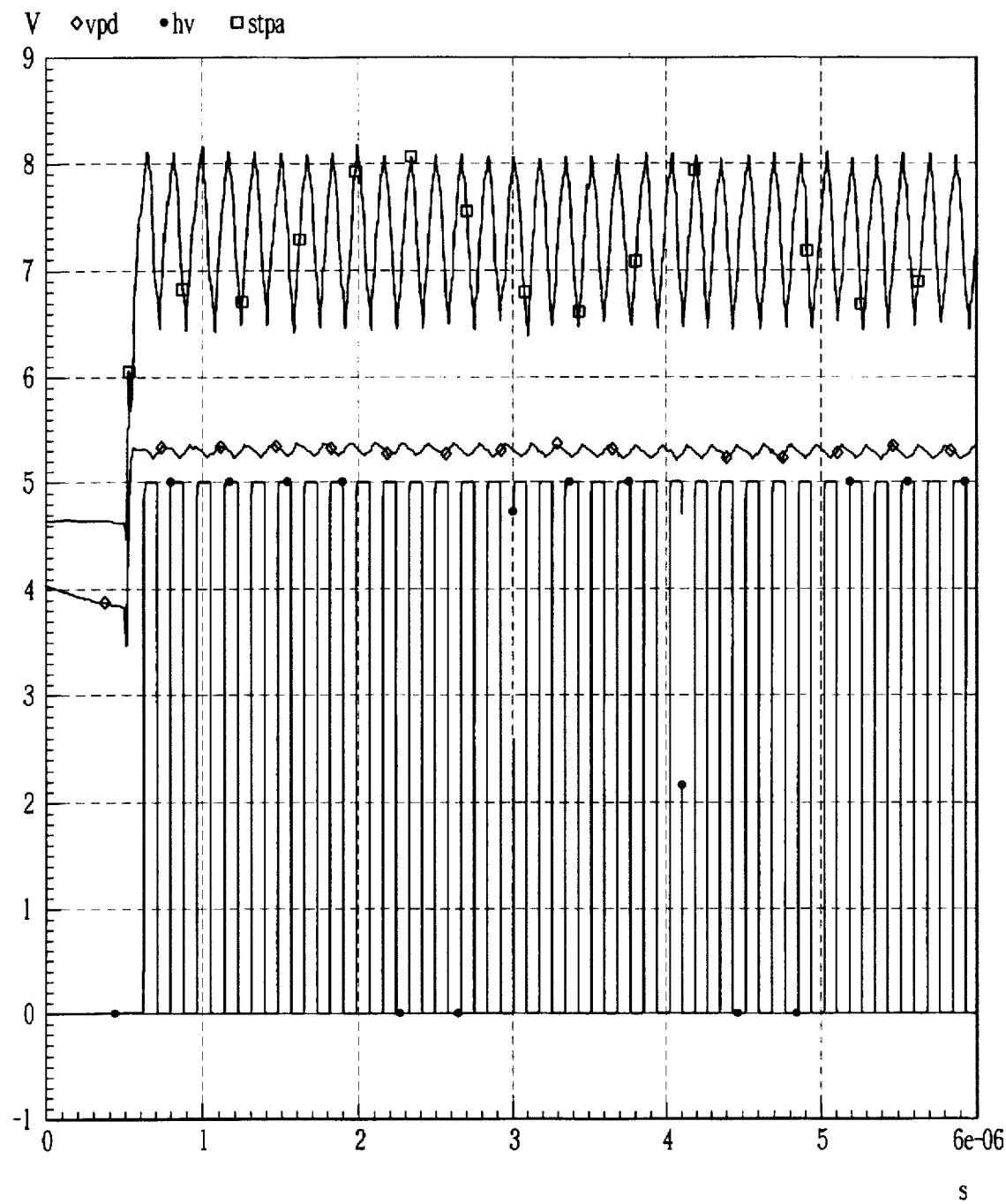
FIG. 13 is a plot of the drain voltage Vpd applied to a bit line and the corresponding pattern of the output voltage hv from the voltage generator for a simulation carried out according to a preferred embodiment of the invention.

The pattern of the drain voltage Vpd to be applied to the bit line 5 and the corresponding pattern of the output voltage hv from the voltage generator 4, shown in FIG. 13, are the outcome of a simulation carried out by the Applicant, at a supply voltage value of 5 volts and a temperature of 27° C.

In conclusion, the voltage generator 4 of the preferred embodiment offers the following advantages over its prior art counterparts:

The provision of only four phase generators 9, as against the eight generators required by conventional circuits, affords considerable savings in occupied area;

The provision, within the clock generator 7, of a closed loop 14 of inverters affords improved control of the clock signal phase shifts;

The provision of a clock generator 77 according to a preferred embodiment of the invention affords a regulation of the oscillation frequency f which can compensate for the variations in equivalent resistance of the charge pump circuits brought about by variations in the supply voltage Vcc;

By providing the limiter circuit 13, it becomes possible to control the internal voltages of the charge pump circuits, thereby ensuring proper operation of the same;

The provision of three-terminal capacitors adapted to utilize the interpoly oxide of the integrated circuit affords additional considerable savings in terms of the occupied area of a semiconductor chip.

While various preferred embodiments have been described in this application for illustrative purposes, the claims are not so limited. Rather, any equivalent method or device operating according to principles of the invention falls within the scope thereof.

We claim:

1. A voltage generator for electrically programmable non-volatile memory cells, comprising:

a plurality of charge pump circuits, each of which has respective inputs and an output, the inputs being controlled by a respective plurality of phase generators, and the output being connected to an output terminal of the voltage generator; and wherein the plurality of charge pump circuits are grouped in pairs of first and second charge pump circuits, the first charge pump circuits being active while the second charge pump circuits are inactive, and the second charge pump circuits being active while the first charge pump circuits are inactive.

2. A voltage generator according to claim 1 wherein each of the phase generators are connected to a respective plurality of the charge pump circuits through a bus to supply a plurality of phase signals, the phase signals having the same frequency and being shifted in phase from each other by a selected increment, the phase signals being supplied to control the pairs of first and second charge pump circuits, each first charge pump circuit being controlled in opposition to each respective second charge pump circuit.

3. A voltage generator according to claim 2 wherein the plurality of phase generators are connected to a clock generator circuit, the clock generator circuit receiving a control signal and outputting a plurality of clock signals having the same frequency and being shifted in phase from each other by a selected increment.

4. A voltage generator according to claim 2, further comprising a voltage limiter circuit having an input and an output, the input being connected to the output terminal of the voltage generator, the output being connected to each of the plurality of charge pump circuits; and wherein the voltage limiter circuit further receives a control signal and a programming voltage signal for programming the memory cells.

5. A voltage generator according to claim 1, further comprising at least four pairs of the charge pump circuits being connected to respective ones of the plurality of phase generators, wherein each first charge pump circuit receives first, second, and third phase signals and each second charge pump circuit receives the first and third phase signals and a fourth phase signal; and wherein each of the first, second, third, and fourth phase signals is of the same frequency and is shifted in phase from the other phase signals by one eighth of the period of the phase signals.

6. A phase generator for a programming circuit for a matrix array of electrically programmable non-volatile memory cells, comprising an input terminal and first, second, third, and fourth output terminals, the input terminal being connected to the output terminals through first and second input logic converters and, respectively, first, second, third, and fourth circuit legs, the respective circuit legs producing first, second, third, and fourth feedback signals.

7. A charge pump circuit for a programming circuit for a matrix array of electrically programmable non-volatile memory cells comprising at least first, second, and third input terminals receiving respective phase signals from a phase generator, the input terminals being connected to an output terminal of the charge pump circuit through first, second, and third pump capacitors, respectively.

8. A voltage generator for electrically programmable non-volatile memory cells comprising:

a plurality of charge pump circuits arranged in pairs of first and second charge pump circuits, an output node of each charge pump circuit being connected to an output terminal of the voltage generator; and wherein each pair of first and second charge pump circuits receives a set of phase signals, wherein each pair of first and second charge pump circuits is controlled by the phase signals whereby each first charge pump circuit is active while the corresponding second charge pump circuit is inactive, and each second charge pump circuit is active while the corresponding first charge pump circuit is inactive.

9. A voltage generator according to claim 8 wherein each phase signal has the same frequency and is shifted in phase by a selected increment with respect to every other phase signal.

10. A voltage generator according to claim 9 wherein each first charge pump circuit receives first, second, and third phase signals wherein each second charge pump circuit receives the first and third phase signals and a fourth phase signal.

11. A voltage generator for electrically programmable non-volatile memory cells, comprising a plurality of charge pump circuits having their inputs controlled by a plurality of phase generators and their outputs connected to an output terminal of the voltage generator, wherein said charge pump circuits are laid as pairs of first and second charge pump circuits, the first charge pump circuits being active while the second charge pump circuits are inactive, and vice versa.

12. A voltage generator according to claim 11 wherein each of said phase generators, connected to said charge pump circuits through a bus, supplies a plurality of phase signals, having the same frequency and being shifted in phase from each other by a suitable amount, for controlling in opposition phase the pairs of charge pump circuits.

13. A voltage generator according to claim 12 wherein said phase generators are connected to a clock generator circuit being input a control signal and outputting a plurality of clock signals with the same frequency and shifted in phase from each other by a suitable amount.

14. A voltage generator according to claim 11, further comprising a voltage limiter circuit having an input connected to the output terminal of the voltage generator and an output connected to the charge pump circuits, said voltage limiter circuit being input a control signal and a programming voltage signal for programming the memory cells.

15. A voltage generator according to claim 11, further comprising at least four pairs of charge pump circuits connected to respective phase generators, each first charge pump circuit being input first, second and third phase signals, each second charge pump circuit being input a fourth phase signal and said first and third phase signals, said phase signals being shifted in phase from each other by one eighth of a period.

16. A voltage generator according to claim 11 wherein each of said charge pump circuits includes at least first, second and third input terminals receiving respective phase signals from one of the phase generators, said circuits being connected to an output terminal through first, second and third pump capacitors.

17. A voltage generator according to claim 16 wherein said first input terminal is connected to said first pump capacitor through an enabling circuit comprising first and second transistors connected, in parallel with each other, between the first pump capacitor, the first input terminal and a ground voltage reference of the charge pump circuit, the control terminals of said transistors including first and second enabling terminals of the enabling circuit respectively receiving first and second enabling signals which are complementary of each other.

18. A voltage generator according to claim 16 wherein said second and third pump capacitors are connected to the output terminal of the charge pump circuit through a decoupling circuit comprising first, second and third MOS transistors.

19. A voltage generator according to claim 13 wherein said clock generator circuit comprises a loop of a plurality of primary inverters and secondary inverters which supply, on a plurality of outputs, said clock signals, each of said primary inverters having an input terminal connected to an output terminal of a secondary inverter preceding it in the loop and to a ground voltage reference, through a MOS transistor controlled by a secondary control signal which corresponds to the negated control signal, in parallel with a capacitor, and having an output terminal connected to a first input of the secondary inverter lying next to it in the loop, and to one of the outputs.

20. A voltage generator according to claim 11 wherein said first, second and third pump capacitors comprise three-terminal capacitors in a parallel type of connection.

21. A charge pump circuit for a programming circuit of a matrix array of electrically programmable non-volatile memory cells, comprising at least first, second and third input terminals receiving respective phase signals from a phase generator, wherein said input terminals are connected to an output terminal of the charge pump circuit through first, second and third pump capacitors, respectively.

22. A charge pump circuit according to claim 21 wherein said first input terminal is connected to said first pump capacitor through an enabling circuit which comprises first and second MOS transistors connected, in parallel with each other, between the first pump capacitor and respectively the first input terminal and a ground voltage reference, the control terminals of said transistors including first and second enabling terminals of the enabling circuit and receiving first and second enabling signals which are complementary of each other.

23. A charge pump circuit according to claim 21 wherein said second and third pump capacitors are connected to the output terminal through a decoupling circuit comprising first, second and third MOS transistors, the first transistor having its control and drain terminals connected together and to the source terminal of the second transistor, as well as to the source terminal of the third transistor and to the second pump capacitor, and having its source terminal connected to the drain terminal of the second transistor and to the control terminal of the third transistor, as well as to the third pump capacitor, and the second transistor also having its control terminal connected to the drain terminal of the third transistor, in turn connected to the output terminal of the charge pump circuit.

24. A phase generator for a programming circuit of a matrix array of electrically programmable non-volatile memory cells, comprising an input terminal and first, second, third and fourth output terminals, wherein said input terminal is connected to said output terminals respectively through a series of first and second input logic inverters and respectively first, second, third and fourth circuit legs outputting first, second, third and fourth feedback signals.

25. A phase generator according to claim 24, further comprising first, second, third and fourth output logic inverters connected between said circuit legs and respective output terminals of the phase generator.

26. A phase generator according to claim 24 wherein said first feedback signal supplies the second circuit leg, said second feedback signal supplies, through a first feedback logic inverter, the first circuit leg, and, through a second feedback logic inverter, the fourth circuit leg, said third feedback signal supplies, through a third feedback logic inverter, the fourth circuit leg, and said fourth feedback signal supplies the second and third circuit legs.

27. A clock generator circuit for a programming circuit of a matrix array of electrically programmable non-volatile memory cells, comprising a loop of a plurality of primary inverters and secondary inverters supplying clock signals on a plurality of outputs, each of said primary inverters having an input terminal connected to an output terminal of a secondary inverter preceding it in the loop, and to a ground voltage reference through a MOS transistor controlled by a secondary control signal which corresponds to a negated control signal, in parallel with a capacitor, and having an output terminal connected to a first input of the secondary inverter lying next to it in the loop, and to one of the outputs.

28. A clock generator circuit according to claim 27 wherein said loop further comprises a logic gate of the NAND type having a first input connected to the output terminal of one of the primary inverters and an output connected to said first input of one of the secondary inverters, said logic gate being input the control signal, each of said secondary inverters having second and third input terminals which receive a pair of reference signals being generated by a reference circuit and complementary of each other.

29. A charge pump circuit according to claim 21, characterized in that said first, second and third pump capacitors are three-terminal capacitors in a parallel type of connection.

30. A programming circuit for a matrix array of electrically programmable non-volatile memory cells, comprising at least one voltage regulator as claimed in claim 11.

31. A programming circuit for a matrix array of electrically programmable non-volatile memory cells, comprising at least one charge pump circuit as claimed in claim 21.

32. A programming circuit for a matrix array of electrically programmable non-volatile memory cells, comprising at least one phase generator as claimed in claim 24.

33. A programming circuit for a matrix array of electrically programmable non-volatile memory cells, comprising at least one clock generator circuit as claimed in claim 27.

34. A method for supplying voltage to electrically programmable non-volatile memory cells, comprising the steps of:

activating a plurality of first charge pump circuits and deactivating a respective plurality of second charge pump circuits during a first selected period of time; and deactivating the plurality of first charge pump circuits and activating the respective plurality of second charge pump circuits during a second selected period of time.

35. A method according to claim 34, further comprising the step of generating a plurality of phase signals to control the activation and deactivation of the plurality of first charge pump circuits and the respective plurality of second charge pump circuits.

36. A method according to claim 38 wherein the steps are repeated in succession.

* * * * *